United States Patent
Yamaguchi et al.

(10) Patent No.: US 10,027,012 B2
(45) Date of Patent: Jul. 17, 2018

(54) MULTILAYER WIRING PLATE AND METHOD FOR FABRICATING SAME

(71) Applicant: HITACHI CHEMICAL COMPANY, LTD., Tokyo (JP)

(72) Inventors: Hiroyuki Yamaguchi, Tokyo (JP); Hajime Nakayama, Tokyo (JP); Haruo Ogino, Tokyo (JP); Seiichi Kurihara, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 73 days.

(21) Appl. No.: 14/762,440

(22) PCT Filed: Jan. 27, 2014

(86) PCT No.: PCT/JP2014/051703
§ 371 (c)(1),
(2) Date: Jul. 21, 2015

(87) PCT Pub. No.: WO2014/119520
PCT Pub. Date: Aug. 7, 2014

(65) Prior Publication Data
US 2015/0357699 A1    Dec. 10, 2015

(30) Foreign Application Priority Data

Jan. 30, 2013    (JP) .................................. 2013-015449

(51) Int. Cl.
*H01P 5/08* (2006.01)
*H01P 3/08* (2006.01)
(Continued)

(52) U.S. Cl.
CPC ................ *H01P 5/085* (2013.01); *H01P 3/06* (2013.01); *H01P 3/08* (2013.01); *H01P 11/005* (2013.01);
(Continued)

(58) Field of Classification Search
CPC .... H01P 5/085; H01P 3/06; H01P 3/08; H01P 11/005; H01P 11/003; H05K 1/0237;
(Continued)

(56) References Cited

U.S. PATENT DOCUMENTS 4,743,710 A * 5/1988 Shieber ................ H05K 1/0219
174/261

FOREIGN PATENT DOCUMENTS

JP    S45-021434 B    7/1970
JP    H3-165595 A    7/1991
(Continued)

OTHER PUBLICATIONS

International Search Report dated Mar. 11, 2014 for PCT/JP2014/051703 (2pgs).

*Primary Examiner* — Benny Lee
*Assistant Examiner* — Hafizur Rahman
(74) *Attorney, Agent, or Firm* — Fitch, Even, Tabin & Flannery, LLP (57) ABSTRACT

A multilayer wiring plate includes a coaxial wire includes a signal line, an insulation coating and an outer peripheral conductor. An insulating layer is arranged on an inner or outer layer side. A metal film circuit is arranged by the intermediary of the insulating layer, and the metal film circuit and the outer peripheral conductor and signal line of the coaxial wire are connected. A signal line connection part that connects the signal line to the metal film circuit includes a penetration hole A that passes through the insulating layer and the outer peripheral conductor; the coaxial wire from which the outer peripheral conductor is removed inside the penetration hole A; a hole filling resin filled inside the penetration hole A; a penetration hole B that passes through the hole filling resin and the signal line; and a plated layer arranged on an inner wall of the penetration hole B.

12 Claims, 4 Drawing Sheets

(51) Int. Cl.
*H01P 3/06* (2006.01)
*H05K 1/02* (2006.01)
*H05K 3/42* (2006.01)
*H05K 3/46* (2006.01)
*H01P 11/00* (2006.01)

(52) U.S. Cl.
CPC ........... *H05K 1/0237* (2013.01); *H05K 3/429* (2013.01); *H05K 3/4652* (2013.01); *H01P 11/003* (2013.01); *H05K 2201/09509* (2013.01); *H05K 2201/09581* (2013.01); *H05K 2201/09809* (2013.01); *H05K 2201/10287* (2013.01); *H05K 2201/10356* (2013.01); *Y10T 29/49167* (2015.01)

(58) Field of Classification Search
CPC ................. H05K 3/429; H05K 3/4652; H05K 2201/09509; H05K 2201/09581; H05K 2201/09809; H05K 2201/10287; H05K 2201/10356; Y10T 29/49167
USPC .................................................. 333/185, 238
See application file for complete search history.

(56) References Cited

FOREIGN PATENT DOCUMENTS

| | | | | |
|---|---|---|---|---|
| JP | H4-342191 A | | 11/1992 | |
| JP | H04342191 A | * | 11/1992 | ............... H05K 3/46 |
| JP | H5-152760 A | | 10/1993 | |
| JP | H5-267845 A | | 10/1993 | |

* cited by examiner

MULTILAYER WIRING PLATE AND METHOD FOR FABRICATING SAME

CROSS-REFERENCE TO RELATED APPLICATIONS

This Application is a U.S. National Stage Application filed under 35 U.S.C. § 371 of International Application PCT/JP2014/051703, filed Jan. 27, 2014, designating the United States, which claims priority from Japanese Patent Application 2013-015449, filed Jan. 30, 2013, the complete disclosures of which are hereby incorporated herein by reference in their entirety for all purposes.

TECHNICAL FIELD

The present invention relates to a multilayer wiring plate and a method for fabricating the same, and in particular, relates to a multilayer wiring plate having wiring using a coaxial wire and a method for fabricating the same.

BACKGROUND ART

In recent years, a higher wiring density has been demanded for a wiring plate with the advancement of functionality of electronic devices. As a wiring plate at such a high wiring density, there are known a multilayer wiring plate (hereinafter, sometimes called "multiwire wiring plate") which includes a circuit formed by wiring an insulation-coated wire (hereinafter, sometimes called "insulation coated wire". A "wire" means a core wire to be a signal line, and is sometimes called "signal line".) and a multilayer wiring plate (hereinafter, sometimes called "general multilayer wiring plate") which does not include a circuit by the insulation coated wire, and for which a circuit is formed by circuit-processing a metal film formed of copper foil or a plated layer. Hereinafter, the multiwire wiring plate or the general multilayer wiring plate is sometimes, simply called "multilayer wiring plate".

One example of the multiwire wiring plate is, as disclosed in Japanese Examined Patent Publication No. S45-021434 (Patent Literature 1), the one fabricated by forming an adhesive sheet for wiring (an insulating layer having adhesiveness to an insulation coated wire) on an inner layer circuit board where circuits of a power source, a ground and the like are formed, then wiring a wire insulation-coated with a polyimide resin or the like by a numerical control wiring machine, fixing the insulation coated wire by lamination by heating and pressurizing or the like, opening a penetration hole that passes through a wire (signal line) of the insulation coated wire, executing plating inside the penetration hole, and forming a through-hole connecting the formed plated layer to the wire. Here, wiring is an operation of routing the insulation coated wire on the adhesive sheet for wiring and simultaneously bonding the insulation coated wire to the adhesive sheet by ultrasonic waves.

One example of the general multilayer wiring plate is the one fabricated by laminating a plurality of inner layer circuit boards each having an inner layer circuit, opening a penetration hole so as to pass through the inner layer circuits, executing plating to the whole including the penetration hole, forming a through-hole connecting the formed plated layer to the inner layer circuits, and executing circuit-processing to the copper foil of an outermost layer and the plated layer. As a method of the circuit-processing, there are generally known a forming method of etching and removing an unrequired part of the copper foil or the plated layer (subtraction method), a forming method of plating a required part (additive method), and a forming method of plating the required part of the copper foil or the plated layer and then etching and removing the unrequired part of the copper foil or the plated layer (semi-additive method). Hereinafter, the circuit formed by etching and removing the unrequired part of the copper foil (metal foil) or the plated layer is sometimes called "etching circuit". As in the subtraction method, the additive method and the semi-additive method described above, the circuit formed by circuit-processing the metal film formed by the copper foil (metal foil) or the plated layer is sometimes called "metal film circuit". Moreover, as a method of laminating the plurality of inner layer circuit boards, there are known a pin lamination method of alternately piling up the plurality of inner layer circuit boards each having the inner layer circuit and insulators to be insulating layers with a positioning pin as a reference, and laminating them altogether by heating and pressurizing, and a buildup method of forming a desired number of wiring layers by repeating, for a required number of times, a process of piling up and laminating an insulator to be an insulating layer and a copper foil layer by layer on an inner layer circuit board having an inner layer circuit, forming a penetration hole or a non-penetration hole, executing plating, and forming a circuit by etching and removing the unrequired part of the copper foil and the plated layer.

On the other hand, a multilayer wiring plate that copes with a high frequency has been demanded, and as such a multilayer wiring plate, a multiwire wiring plate having a coaxial wire is known. The coaxial wire is a wire for which an outer peripheral conductor for shielding (hereinafter, sometimes called "shield layer") is formed on an outer periphery of a wire to be a signal line through an insulating layer. As a method for fabricating the multiwire wiring plate using the coaxial wire, there is known a fabricating method of removing the insulating layer by irradiating a part where a penetration hole connecting a circuit and the wire (signal line) of the coaxial wire is formed and a part where a non-penetration hole connecting the circuit and the outer peripheral conductor (shield layer) of the coaxial wire is formed with plasma from a surface layer side of the multiwire wiring plate (Patent Literature 2).

CITATION LIST

Patent Literature

Patent Literature 1: Japanese Examined Patent Publication No. S45-021434
Patent Literature 2: Japanese Patent Application Laid-Open No. H05-152760

SUMMARY OF INVENTION

Technical Problem

Acceleration of electronic devices has advanced, and for electric signals flowing inside a wiring plate, a frequency is increasingly higher in order to transmit more information in a short time. Therefore, in a general multilayer wiring plate whose density increases, electromagnetic interference called crosstalk noise cannot be ignored as influence between adjacent conductors.

The same is true for the multiwire wiring plate, and in order to cope with the demand of higher density, a wire pitch has become finer (0.3 mm or shorter), and therefore, crosstalk between adjacent wires due to the electromagnetic interference occurs as a problem.

In Patent Literature 2, while the coaxial wire is used in order to cope with the high frequency, a processing distance by the plasma is long, and there are a problem that processing variation is large and a problem that it is difficult to adjust a processing condition since plasma is radiated from the surface layer side of the multilayer wiring plate to remove the insulating layer on the surface layer side and expose the outer peripheral conductor of the coaxial wire. Therefore, exposure of the outer peripheral conductor of the coaxial wire becomes incomplete, removal of the outer peripheral conductor by etching to be performed later becomes incomplete, and the outer peripheral conductor tends to remain. Thus, when opening a penetration hole passing through the coaxial wire, performing plating and forming a through-hole in a subsequent step, there is a possibility that the remaining outer peripheral conductor of the coaxial wire and the signal line are conducted through the plated layer and a sufficient shield effect cannot be obtained.

In order to solve these, as a method for fabricating the multilayer wiring plate using the coaxial wire, possibly considered is a method of arranging the coaxial wire in an inner layer, laminating it by an insulator to be an insulating layer, then removing the insulating layer on the surface layer side, the outer peripheral conductor (shield layer) of the coaxial wire and insulation coating on a wire (signal line) outer periphery from the surface layer side of the multilayer wiring plate by laser processing, forming a penetration hole, exposing only the wire (signal line), forming a through-hole by performing plating, and connecting the wire (signal line) of the coaxial wire to the through-hole. However, in the case that a plate thickness of the multilayer wiring plate is large and a laser processing distance from a surface to the coaxial wire is long (in the case that a surface layer insulating layer is thick), it is difficult to adjust output of a laser in order to suppress roughness of an inner wall of the penetration hole formed by laser processing and leave only the wire (signal line) while removing the insulating layer, the outer peripheral conductor (shield layer) of the coaxial wire and the insulation coating on the wire (signal line) outer periphery. Therefore, there is a possibility that removal of the insulating layer of the surface layer of the multilayer wiring plate and the outer peripheral conductor of the coaxial wire becomes incomplete or, conversely, even the signal line of the coaxial wire is fused and removed, normal conduction cannot be obtained when forming a through-hole and the sufficient shield effect cannot be obtained.

The present invention is implemented in consideration of the above-described problems, and an object is to provide a multilayer wiring plate in which crosstalk is suppressed and a transmission characteristic is excellent since a shield effect of a coaxial wire is excellent, and a method for fabricating the same.

Solution to Problem

The present invention is a multilayer wiring plate, wherein a coaxial wire including a signal line, an insulation coating around the signal line, and an outer peripheral conductor arranged on the insulation coating, is arranged in an inner layer, an insulating layer is arranged on an inner layer side or an outer layer side with respect to the coaxial wire, a metal film circuit formed by circuit-processing metal foil or a plated layer is arranged by the intermediary of the insulating layer, and the metal film circuit and the outer peripheral conductor or signal line of the coaxial wire are connected, in which a signal line connection part that connects the signal line of the coaxial wire to the metal film circuit, includes: a penetration hole A that passes through the insulating layer and the outer peripheral conductor of the coaxial wire; the coaxial wire arranged inside the penetration hole A in a state in which the outer peripheral conductor is removed and the coaxial wire includes the signal line; a hole filling resin filled inside the penetration hole A; a penetration hole B that passes through the hole filling resin and the signal line of the coaxial wire; and the plated layer arranged on an inner wall of the penetration hole B.

In the present invention, since the coaxial wire is used, a shield effect is excellent, and since unrequired radiation radio waves by high speed signals of the signal line are not generated, the multilayer wiring plate in which there is no crosstalk between adjacent signal lines and a transmission characteristic is excellent can be obtained.

The signal line connection part that connects the signal line of the coaxial wire and the metal film circuit is a double structure of the penetration hole A and the penetration hole B whose diameter is one size smaller than that of the penetration hole A, and for the penetration hole A on the outer side, the signal line of the coaxial wire is arranged in the state that the outer peripheral conductor is removed and the hole filling resin is filled, the penetration hole B on the inner side is provided so as to pass through the hole filling resin and the signal line of the coaxial wire, and the plated layer is provided on the inner wall. In this way, when forming the penetration hole A, since the outer peripheral conductor of the coaxial wire is just removed first, for example, a method of removing the insulating layer of the surface layer of the multilayer wiring plate to the vicinity of the coaxial wire by drilling and then removing the remaining insulating layer of the surface layer and the outer peripheral conductor by a laser can be used, and processing by the laser can be substantially little compared to the case of performing it from a surface of the multilayer wiring plate. Therefore, it is easy to adjust and manage a processing condition, and the signal line can be left while surely removing the outer peripheral conductor of the coaxial wire. Further, since the penetration hole B is provided so as to pass through the hole filling resin filled in the penetration hole A and the signal line of the coaxial wire, a connection with the plated layer formed on the inner wall can be surely obtained.

Preferably, in the multilayer wiring plate, the metal film circuit arranged on the inner layer side with respect to the coaxial wire is a ground, and the outer peripheral conductor of the coaxial wire is connected to the ground through the metal film circuit arranged on the outer layer with respect to the coaxial wire.

In the present invention, since the ground is arranged on the inner layer side with respect to the coaxial wire, the coaxial wire can be arranged closely to the surface layer of the multilayer wiring plate, so that it becomes easy to adjust and manage the processing condition by a drill or the laser for removing the outer peripheral conductor of the coaxial wire. Since the outer peripheral conductor of the coaxial wire is connected with the ground through the metal film circuit arranged on the outer layer with respect to the coaxial wire, interlayer connections (a non-penetration through-hole or a penetration through-hole) for performing such a connection can be formed from the surface layer side, so that the interlayer connections are easily formed and the ground is surely connected.

Preferably, in the multilayer wiring plate, the metal film circuit arranged on the outer layer with respect to the coaxial wire and the ground are connected through a non-penetration through-hole or a penetration through-hole.

In the present invention, since the connection can be performed by the interlayer connection generally used in the multilayer wiring plate, the sure connection can be obtained.

The present invention is a method for fabricating one of the multilayer wiring plates described above, the method for fabricating the multilayer wiring plate comprising: a step of forming a non-penetration hole A of a depth such that the non-penetration hole does not reach the outer peripheral conductor of the coaxial wire from each of front and back surfaces of the multilayer wiring plate; a step of laser-processing a bottom part of the non-penetration hole A, removing the outer peripheral conductor of the coaxial wire, leaving the signal line, and forming the penetration hole A; a step of filling the hole filling resin inside the penetration hole A; a step of forming the penetration hole B of a diameter smaller than a diameter of the penetration hole A in the hole filling resin filled inside the penetration hole A, and exposing a cross section of the signal line of the coaxial wire to an inner wall of the penetration hole B; and a step of forming the plated layer inside the penetration hole B where the cross section of the signal line of the coaxial wire is exposed.

In the present invention, when forming the penetration hole A, the method of removing the insulating layer of the surface layer of the multilayer wiring plate to the vicinity of the coaxial wire by drilling and then removing the remaining insulating layer of the surface layer and the outer peripheral conductor by the laser can be used, and since the processing by the laser can be relatively little, it is easy to adjust and manage the processing condition, and the signal line can be left while surely removing the outer peripheral conductor of the coaxial wire. Further, since the penetration hole B is provided so as to pass through the hole filling resin filled in the penetration hole A and the signal line of the coaxial wire, the connection with the plated layer formed on the inner wall can be surely obtained.

Preferably, the method for fabricating the multilayer wiring plate further comprises: a step of forming a non-penetration hole B reaching the outer peripheral conductor of the coaxial wire from the metal film circuit on the outer layer side with respect to the coaxial wire, and exposing the outer peripheral conductor of the coaxial wire to a bottom part of the non-penetration hole; and a step of forming the plated layer inside the non-penetration hole B where the outer peripheral conductor of the coaxial wire is exposed.

In the present invention, since the outer peripheral conductor of the coaxial wire is connected with the metal film circuit arranged on the outer layer with respect to the coaxial wire through the interlayer connection (non-penetration through-hole) by the non-penetration hole B, the interlayer connection can be formed from the surface layer side, the interlayer connection is easily formed, and the connection is surely performed.

Advantageous Effects of Invention

According to the present invention, a multilayer wiring plate in which crosstalk is suppressed and a transmission characteristic is excellent and a method for fabricating it can be provided, since a shield effect of a coaxial wire is excellent.

DESCRIPTION OF EMBODIMENTS

Figure 1:
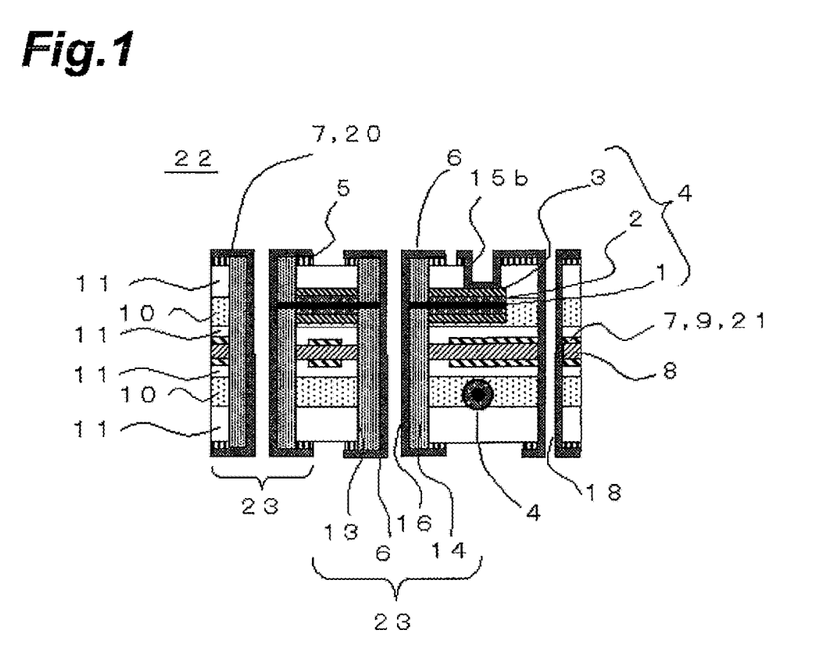
FIG. 1 is a sectional view of a multilayer wiring plate in one embodiment of the present invention.

Hereinafter, embodiments of a multilayer wiring plate of the present invention will be described. FIG. 1 is a sectional view illustrating an outline of a sectional structure of one example of a multilayer wiring plate 22 in the embodiment of the present invention.

First Embodiment

As illustrated in FIG. 1, the multilayer wiring plate 22 in the present embodiment is the multilayer wiring plate 22 in which a coaxial wire 4 including a signal line 1, an insulation coating 2 around it and an outer peripheral conductor 3 arranged on the insulation coating 2 is arranged in an inner layer, an insulating layer 11 is arranged on an inner layer side or an outer layer side with respect to the coaxial wire 4, an etching circuit 7 formed by etching copper foil 5 or a plated layer 6 is arranged by the intermediary of the insulating layer 11, and the outer peripheral conductor 3 and the signal line 1 of the coaxial wire 4 and the etching circuit 7 are connected, and is the multilayer wiring plate 22 in which a signal line connection part 23 that connects the signal line 1 of the coaxial wire 4 and the etching circuit 7 includes a penetration hole A 13 that passes through the insulating layer 11 and the outer peripheral conductor 3 of the coaxial wire 4, the coaxial wire 4 arranged inside the penetration hole A 13 in a state that the outer peripheral conductor 3 is removed and the signal line 1 is included, a hole filling resin 14 filled inside the penetration hole A 13, a penetration hole B 16 that passes through the hole filling resin 14 and the signal line 1 of the coaxial wire 4, and the plated layer 6 arranged on an inner wall of the penetration hole B 16.

As illustrated in FIG. 1, in the multilayer wiring plate 22 in the present embodiment, since the coaxial wire 4 is used, a shield effect is excellent, and since unrequired radiation radio waves by high speed signals of the signal line 1 are not generated, the multilayer wiring plate 22 in which there is no crosstalk between adjacent signal lines and a transmission characteristic is excellent can be obtained. The signal line connection part 23 that connects the signal line 1 of the coaxial wire 4 and the etching circuit 7 is a double structure of the penetration hole A 13 and the penetration hole B 16 whose diameter is one size smaller than that of the penetration hole A 13, and for the penetration hole A 13 on the outer side, the signal line 1 of the coaxial wire 4 is arranged in the state that the outer peripheral conductor 3 is removed and the hole filling resin 14 is filled, the penetration hole B 16 on the inner side is provided so as to pass through the hole filling resin 14 and the signal line 1 of the coaxial wire 4, and the plated layer 6 is provided. In this way, when forming the penetration hole A 13, since the outer peripheral conductor 3 of the coaxial wire 4 is just removed first, for example, a method of removing the insulating layer 11 of the surface layer of the multilayer wiring plate 22 to the vicinity of the coaxial wire 4 by drilling and then removing the remaining insulating layer 11 of the surface layer and the outer peripheral conductor 3 by a laser can be used, and processing by the laser can be substantially little compared to the case of performing it from a surface of the multilayer wiring plate 22. Therefore, it is easy to adjust and manage a processing condition, and the signal line 1 can be left while surely removing the outer peripheral conductor 3 of the coaxial wire 4. Further, since the penetration hole B 16 is provided so as to pass through the hole filling resin 14 filled in the penetration hole A 13 and the signal line 1 of the coaxial wire 4, a connection with the plated layer 6 formed on the inner wall can be surely obtained. Therefore, since the shield effect of the coaxial wire 4 is excellent, the multilayer wiring plate 22 in which the crosstalk is suppressed and the transmission characteristic is excellent can be provided.

Second Embodiment

As illustrated in FIG. 1, in the multilayer wiring plate 22 in the present embodiment, in the first embodiment, the etching circuit 7 arranged on the inner layer side with respect to the coaxial wire 4 is a ground 21, and the outer peripheral conductor 3 of the coaxial wire 4 is connected with the ground 21 through the etching circuit 7 (surface layer circuit 20) arranged on an outer layer with respect to the coaxial wire 4. Thus, since the ground 21 is arranged on the inner layer side with respect to the coaxial wire 4, the coaxial wire 4 can be arranged closely to the surface layer circuit 20 of the multilayer wiring plate 22, so that it becomes easy to adjust and manage the processing condition by a drill or a laser for removing the insulating layer 11 on the outer peripheral conductor 3 of the coaxial wire 4 and exposing the outer peripheral conductor 3. Since the outer peripheral conductor 3 of the coaxial wire 4 is connected with the ground 21 through the etching circuit 7 arranged on the outer layer with respect to the coaxial wire 4, interlayer connections (which refers herein to a non-penetration through-hole 15b or a penetration through-hole A 18) for performing such a connection can be formed from the surface layer side, so that the interlayer connections are easily formed and the ground 21 is surely connected.

Third Embodiment

As illustrated in FIG. 1, in the multilayer wiring plate 22 in the present embodiment, in the first or second embodiment, the etching circuit 7 (surface layer circuit 20) arranged on the outer layer with respect to the coaxial wire 4 and the ground 21 are connected through the penetration through-hole A 18. Instead of the penetration through-hole A 18, the non-penetration through-hole (not shown in the figure) may be used. Thus, since the connection can be performed by the interlayer connection generally used in the multilayer wiring plate, the sure connection can be obtained.

Figure 2:
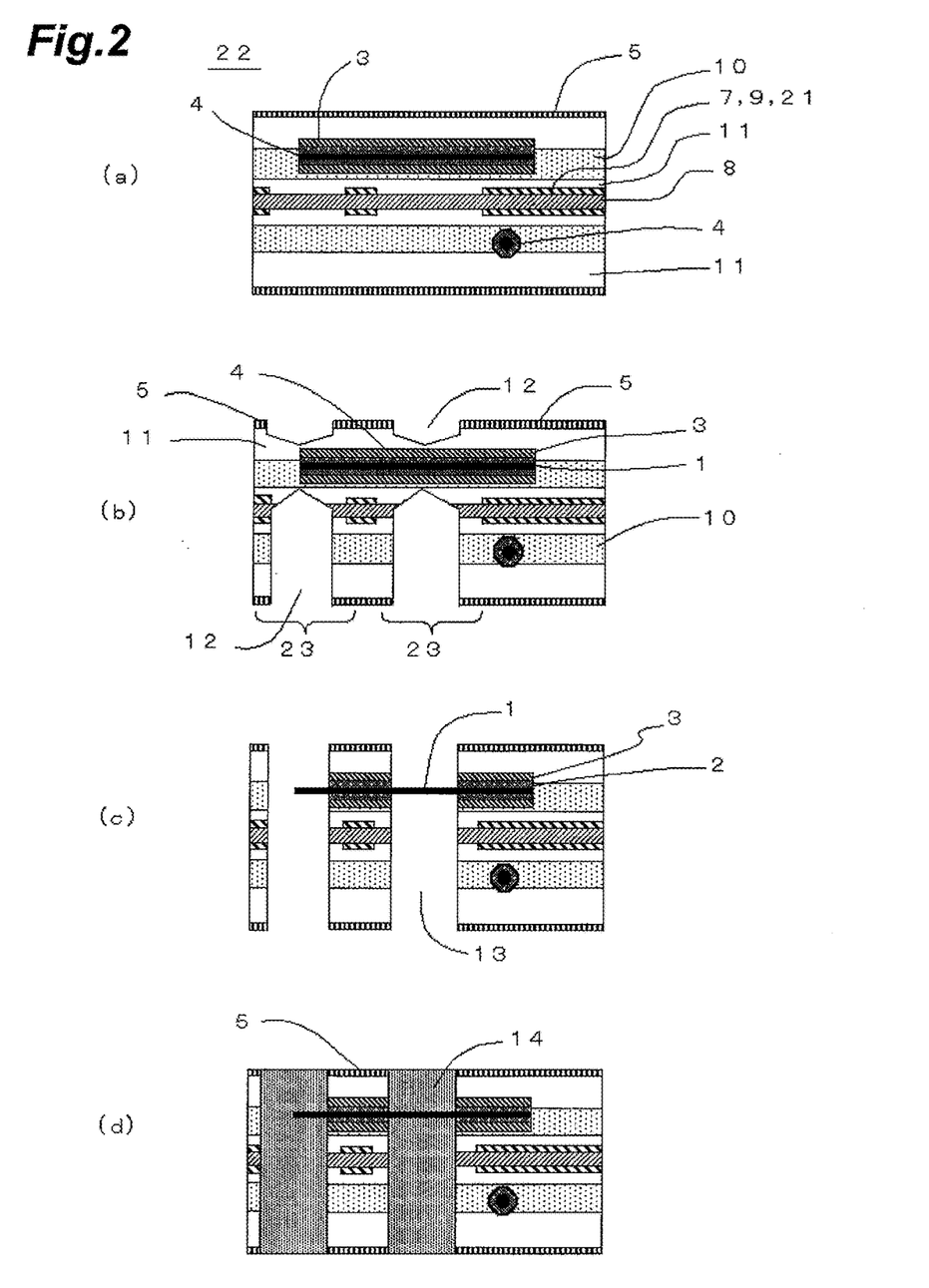
FIG. 2 is a sectional view of fabricating steps (a)-(d) of the multilayer wiring plate in one embodiment of the present invention.
Figure 3:
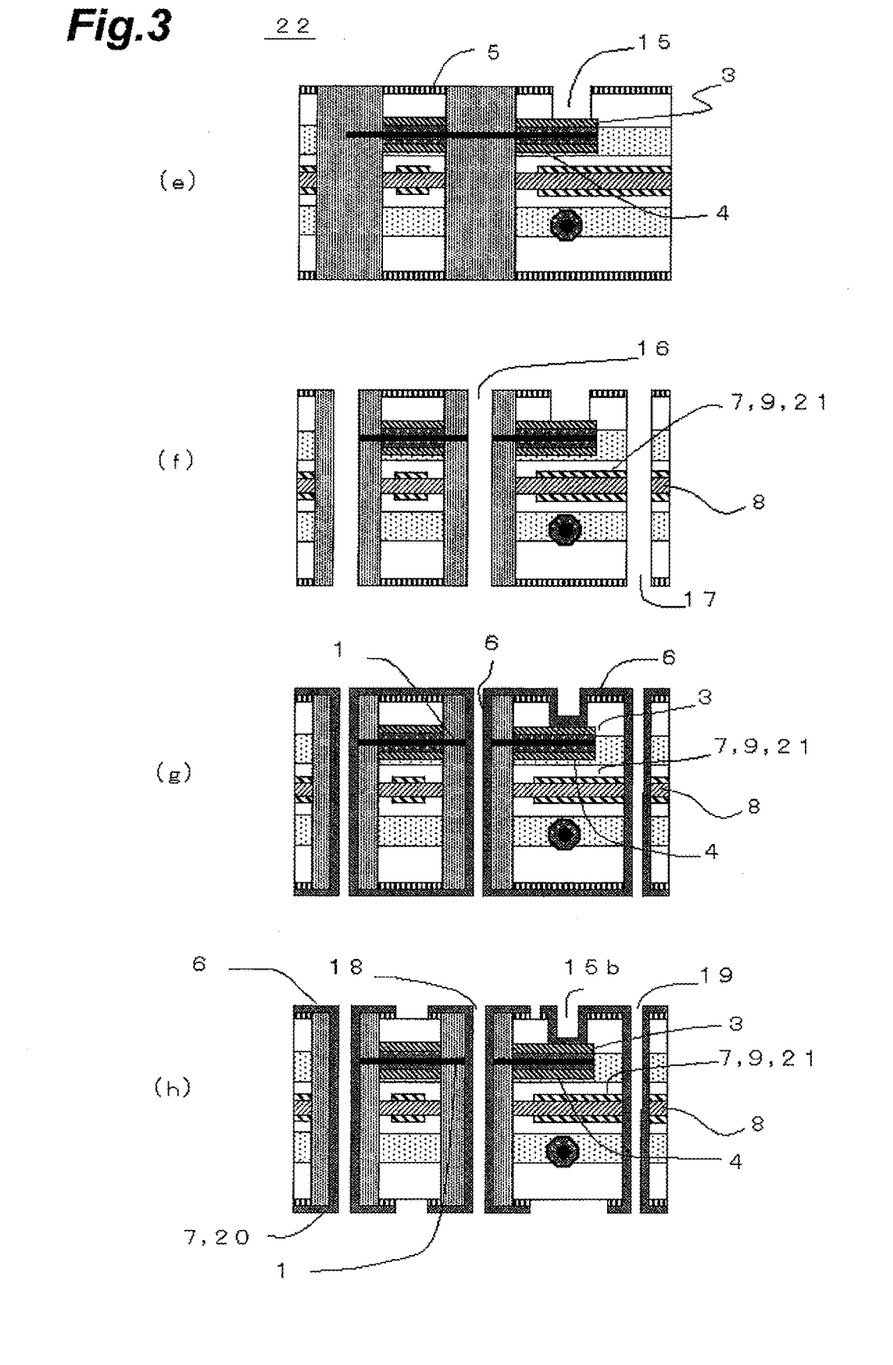
FIG. 3 is a sectional view of fabricating steps (e)-(h) of the multilayer wiring plate in one embodiment of the present invention.

Hereinafter, the embodiment of a method for fabricating the multilayer wiring plate of the present invention will be described. FIG. 2 and FIG. 3 are sectional views illustrating fabricating steps in one example of the method for fabricating the multilayer wiring plate 22 in the embodiment of the present invention.

Fourth Embodiment

As illustrated in FIG. 2 and FIG. 3, the method for fabricating the multilayer wiring plate 22 in the present embodiment comprises a step (FIG. 2(b)) of forming a non-penetration hole A 12 of a depth not reaching the outer peripheral conductor 3 of the coaxial wire 4 from each of front and back surfaces of the multilayer wiring plate 22, a step (FIG. 2(c)) of laser-processing a bottom part of the non-penetration hole A 12, removing the outer peripheral conductor 3 of the coaxial wire 4, leaving the signal line 1, and forming the penetration hole A 13, a step (FIG. 2(d)) of filling the hole filling resin 14 inside the penetration hole A 13, a step (FIG. 3(f)) of forming the penetration hole B 16 of a diameter smaller than that of the penetration hole A 13 in the hole filling resin 14 filled inside the penetration hole A 13, and exposing a cross section of the signal line 1 of the coaxial wire 4 to the inner wall of the penetration hole B 16, and a step (FIG. 3(g)) of forming the plated layer 6 inside the penetration hole B 16 where the cross section of the signal line 1 of the coaxial wire 4 is exposed.

According to the method for fabricating the multilayer wiring plate in the present embodiment, when forming the penetration hole A, the method of removing the insulating layer of the surface layer of the multilayer wiring plate to the vicinity of the coaxial wire by drilling and then removing the remaining insulating layer of the surface layer and the outer peripheral conductor by the laser can be used, and since the processing by the laser can be relatively little, it is easy to adjust and manage the processing condition, and the signal line can be left while surely removing the outer peripheral conductor of the coaxial wire. Further, since the penetration hole B is provided so as to pass through the hole filling resin filled in the penetration hole A and the signal line of the coaxial wire, the signal line of the coaxial wire and the plated layer formed on the inner wall can be surely connected. Therefore, since the shield effect of the coaxial wire is excellent, the method for fabricating the multilayer wiring plate in which the crosstalk is suppressed and the transmission characteristic is excellent can be provided.

Fifth Embodiment

As illustrated in FIG. 3, the method for fabricating the multilayer wiring plate 22 in the present embodiment, in the fourth embodiment, further comprises a step (FIG. 3(e)) of forming a non-penetration hole B 15 reaching the outer peripheral conductor 3 of the coaxial wire 4 from the etching circuit 7 on the outer layer side with respect to the coaxial wire 4, and exposing the outer peripheral conductor 3 of the coaxial wire 4 at a bottom part of the non-penetration hole B 15, and a step (FIG. 3(g)) of forming the plated layer 6 inside the non-penetration hole B 15 where the outer peripheral conductor 3 of the coaxial wire 4 is exposed. Thus, since the outer peripheral conductor 3 of the coaxial wire 4 is connected with the etching circuit 7 arranged on the outer layer with respect to the coaxial wire 4 through the interlayer connection (the non-penetration through-hole 15b) by the non-penetration hole B 15, the interlayer connection can be formed from the surface layer side, the interlayer connection is easily formed, and the connection is surely performed.

Examples

Hereinafter, an example of the present invention will be described using FIG. 1, FIG. 2 and FIG. 3, however, the present invention is not limited by the present example.

Figure 4:
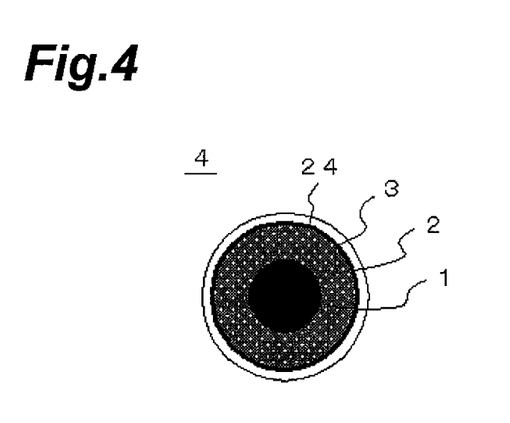
FIG. 4 is a sectional view of a coaxial wire used in the multilayer wiring plate in one embodiment of the present invention.

FIG. 2 and FIG. 3 illustrate an outline of the fabricating steps of the multilayer wiring plate 22 in the present example. FIG. 4 is a sectional view of the coaxial wire 4 used in the multilayer wiring plate 22 in the present example. The coaxial wire 4 includes the signal line 1, the insulation coating 2 around it, the outer peripheral conductor 3 arranged on the insulation coating 2, and an adhesive 24 around it. The adhesive 24 has adhesiveness to an adhesive sheet 10 for wiring. As illustrated in FIG. 2(a), a step is for forming a circuit on a copper clad laminate to form an inner layer circuit board 8 having an inner layer circuit 9, laminating a prepreg (underlay layer) which is the insulating layer 11 on it, laminating the adhesive sheet 10 for wiring on it, wiring and fixing the coaxial wire 4 on it, and laminating the prepreg which is the insulating layer 11 and the copper foil 5 on it. The adhesive sheet 10 for wiring is a UV curing type or a thermosetting type, and as illustrated in FIG. 4, on the outer periphery of the outer peripheral conductor 3 of the coaxial wire 4, the coaxial wire 4 to which the adhesive 24 of the same UV curing type component or thermosetting type component as the adhesive sheet 10 for wiring was executed was wired by a numerical control unit.

Next, as illustrated in FIG. 2(b), in order to form the non-penetration hole A 12 at a position to form the signal line connection part 23 that interlayer-connects the signal line 1 of the coaxial wire 4 and the copper foil 5 of the surface layer, perforation was performed with a drill from the front and back surfaces of the multilayer wiring plate 22 until a drill distal end reaches a position in front of the outer peripheral conductor 3 of the coaxial wire 4 in a plate thickness direction, and the copper foil 5, the insulating layer 11 and the adhesive sheet 10 for wiring were removed.

Next, as illustrated in FIG. 2(c), laser processing was executed from the front and back surfaces of the multilayer wiring plate 22 to the non-penetration hole A 12 perforated by drilling to the front of the outer peripheral conductor 3 of the coaxial wire 4 in the step (b), a resin of the insulating layer 11, an adhesive (not shown in the figure) around the coaxial wire 4, the outer peripheral conductor 3 and the insulation coating 2 were removed to expose the signal line 1 of the coaxial wire 4, and the penetration hole A 13 was formed. In the laser processing, a $CO_2$ laser was radiated in steps, and the signal line 1 was exposed stepwise.

Next, as illustrated in FIG. 2(d), the penetration hole A 13 where the signal line 1 of the coaxial wire 4 was exposed was filled with the hole filling resin 14. A method of filling the hole filling resin 14 was a printing method, and after the hole filling resin 14 was cured, the front and back surfaces were smoothed by polishing the surface layer.

Next, as illustrated in FIG. 3(e), the non-penetration hole B 15 for connecting the outer peripheral conductor 3 of the coaxial wire 4 and the copper foil 5 of the surface layer was perforated until the outer peripheral conductor 3 of the coaxial wire 4 was exposed by the laser processing from the surface layer side of the multilayer wiring plate 22. For the copper foil 5 of the surface layer of the multilayer wiring plate 22, a photosensitive film was used, a part to form the non-penetration hole B 15 was etched and removed beforehand, and perforation was performed by the $CO_2$ laser to a predetermined position. A laser processing condition was adjusted so as not to remove the outer peripheral conductor 3 of the coaxial wire 4.

Next, as illustrated in FIG. 3(f), the penetration hole B 16 for interlayer-connecting the signal line 1 of the coaxial wire 4 and the copper foil 5 of the surface layer was perforated at a position of the signal line 1 of the coaxial wire 4 at a part filled with the hole filling resin 14. At a position where the interlayer connection was required with the ground 21 of the inner layer circuit board 8, a penetration hole C 17 was perforated. For the perforation of the penetration hole B 16 and the penetration hole C 17, the perforation was performed by drilling.

Next, as illustrated in FIG. 3(g), the plated layer 6 was formed on the copper foil 5 of the surface layer of the multilayer wiring plate 22 including the inner wall of the non-penetration hole B 15 for connecting the outer peripheral conductor 3 of the coaxial wire 4 and the copper foil 5 of the surface layer, the inner wall of the penetration hole B 16 for interlayer-connecting the signal line 1 of the coaxial wire 4 and the copper foil 5 of the surface layer and the inner wall of the penetration hole C 17 for interlayer-connecting the copper foil 5 of the surface layer and the ground 21 of the inner layer circuit board 8, and the interlayer connection was formed by the plated layer 6. For preprocessing of the plated layer 6, foreign matters remaining inside holes of the penetration holes B 16 and C 17 and the non-penetration hole B 15 were removed by desmear processing (alkali permanganate aqueous solution), and then the plated layer 6 was formed by electroless copper plating.

Next, as illustrated in FIG. 3(h), the plated layer 6 of the surface layer of the multilayer wiring plate 22 and the copper foil 5 were etched to form the surface layer circuit 20 (etching circuit 7). Thus, the signal line 1 of the coaxial wire 4 and the surface layer circuit 20 were interlayer-connected by the plated layer 6 on the inner wall of the penetration through-hole A 18, the ground 21 of the inner layer circuit board 8 and the outer peripheral conductor 3 of the coaxial wire 4 were interlayer-connected by the plated layer 6 on the inner wall of the penetration through-hole B 19, and the surface layer circuit 20 and the outer peripheral conductor 3 of the coaxial wire 4 were interlayer-connected by the plated layer 6 on the inner wall of the non-penetration through-hole 15b. The surface layer circuit 20 was processed as a circuit and formed by forming a pattern of a dry film by a tenting method, etching and removing an unrequired part, and then peeling and removing the dry film.

From the above, as illustrated in FIG. 1, the multilayer wiring plate 22 was formed in which the coaxial wire 4 including the signal line 1, the insulation coating 2 around it and the outer peripheral conductor 3 arranged on the insulation coating 2 was arranged in the inner layer, the insulating layer 11 was arranged on the inner layer side or the outer layer side with respect to the coaxial wire 4, the etching circuit 7 formed by etching the copper foil 5 or the plated layer 6 was arranged by the intermediary of the insulating layer 11, and the outer peripheral conductor 3 and the signal line 1 of the coaxial wire 4 and the etching circuit 7 were connected, and in which the signal line connection part 23 that connected the signal line 1 of the coaxial wire 4 and the etching circuit 7 included the penetration hole A 13 that passed through the insulating layer 11 and the outer peripheral conductor 3 of the coaxial wire 4, the coaxial wire 4 arranged inside the penetration hole A 13 in the state that the outer peripheral conductor 3 was removed and the signal line 1 was included, the hole filling resin 14 filled inside the penetration hole A 13, the penetration hole B 16 that passed through the hole filling resin 14 and the signal line 1 of the coaxial wire 4, and the plated layer 6 arranged on the inner wall of the penetration hole B 16.

INDUSTRIAL APPLICABILITY

The multilayer wiring plate and the method for fabricating the same in the present invention are industrially effective because the multilayer wiring plate in which the crosstalk is suppressed and the transmission characteristic is excellent and the method for fabricating the same can be provided, since the shield effect of the coaxial wire is excellent.

REFERENCE SIGNS LIST

1 . . . Wire or core wire or signal line
2 . . . Insulation coating

3 . . . Outer peripheral conductor or shield layer
4 . . . Coaxial wire
5 . . . Copper foil or metal foil
6 . . . Plated layer
7 . . . Etching circuit or metal film circuit
8 . . . Inner layer circuit board
9 . . . Inner layer circuit or etching circuit or ground or metal film circuit
10 . . . Adhesive sheet for wiring
11 . . . Insulating layer
12 . . . Non-penetration hole A
13 . . . Penetration hole A
14 . . . Hole filling resin
15 . . . Non-penetration hole B
15b . . . Non-penetration through-hole
16 . . . Penetration hole B
17 . . . Penetration hole C
18 . . . Penetration through-hole A
19 . . . Penetration through-hole B
20 . . . Surface layer circuit or etching circuit or metal film circuit
21 . . . Ground or inner layer circuit or etching circuit or metal film circuit
22 . . . Multilayer wiring plate or multiwire wiring plate
23 . . . Signal line connection part
24 . . . Adhesive

The invention claimed is:

1. A multilayer wiring plate, wherein a coaxial wire including a signal line, an insulation coating around the signal line, and an outer peripheral conductor arranged on the insulation coating, is arranged in an inner layer of the multilayer wiring plate, a metal film circuit formed by circuit-processing metal foil or a plated layer is separated from the coaxial wire by the intermediary of an insulating layer, and the metal film circuit and the outer peripheral conductor are connected, and the metal film circuit and the signal line of the coaxial wire are connected,
    wherein a signal line connection part that connects the signal line of the coaxial wire to the metal film circuit, includes:
    a penetration hole A that passes through the insulating layer and the outer peripheral conductor of the coaxial wire;
    the coaxial wire arranged inside the penetration hole A in a state in which the outer peripheral conductor and the insulation coating are removed from the signal line of the coaxial wire;
    a hole filling resin filled inside the penetration hole A;
    a penetration hole B that passes through the hole filling resin and the signal line of the coaxial wire; and
    a plated layer arranged on an inner wall of the penetration hole B.

2. The multilayer wiring plate according to claim 1, wherein the metal film circuit is a ground, and the outer peripheral conductor of the coaxial wire is connected to the ground through a surface layer circuit.

3. The multilayer wiring plate according to claim 2, wherein the surface layer circuit and the ground are connected through a non-penetration through-hole or a penetration through-hole.

4. The method for fabricating the multilayer wiring plate according to claim 3, the method comprising:
    a step of forming a non-penetration hole of a depth such that the non-penetration hole does not reach the outer peripheral conductor of the coaxial wire from each of front and back surfaces of the multilayer wiring plate;
    a step of laser-processing a bottom part of the non-penetration hole, removing the outer peripheral conductor of the coaxial wire, leaving the signal line, and forming the penetration hole A;
    a step of filling the hole filling resin inside the penetration hole A;
    a step of forming the penetration hole B of a diameter smaller than a diameter of the penetration hole A in the hole filling resin filled inside the penetration hole A, and exposing a cross section of the signal line of the coaxial wire to an inner wall of the penetration hole B;
    a step of forming the plated layer inside the penetration hole B where the cross section of the signal line of the coaxial wire is exposed;
    a step of forming a non-penetration hole reaching the outer peripheral conductor of the coaxial wire from the surface layer circuit, and exposing the outer peripheral conductor of the coaxial wire to a bottom part of the non-penetration hole; and
    a step of forming the plated layer inside the non-penetration hole where the outer peripheral conductor of the coaxial wire is exposed.

5. A method for fabricating the multilayer wiring plate according to claim 1, the method comprising:
    a step of forming a non-penetration hole of a depth such that the non-penetration hole does not reach the outer peripheral conductor of the coaxial wire from each of front and back surfaces of the multilayer wiring plate;
    a step of laser-processing a bottom part of the non-penetration hole, removing the outer peripheral conductor of the coaxial wire, leaving the signal line, and forming the penetration hole A;
    a step of filling the hole filling resin inside the penetration hole A;
    a step of forming the penetration hole B of a diameter smaller than a diameter of the penetration hole A in the hole filling resin filled inside the penetration hole A, and exposing a cross section of the signal line of the coaxial wire to an inner wall of the penetration hole B; and
    a step of forming the plated layer inside the penetration hole B where the cross section of the signal line of the coaxial wire is exposed.

6. A multilayer wiring plate, comprising:
    a coaxial wire including a signal line, an insulation coating around the signal line, and an outer peripheral conductor arranged on the insulation coating;
    a metal film circuit;
    an insulating layer provided between the coaxial wire and the metal film circuit;
    a signal line connection part connecting the signal line of the coaxial wire to the metal film circuit, the signal line connection part comprising:
    a penetration hole A that passes through the insulating layer and the outer peripheral conductor of the coaxial wire;
    a first portion of the signal line of the coaxial wire arranged inside the penetration hole A in a state in which the outer peripheral conductor and the insulation coating are removed;
    a hole filling resin filling an outer peripheral portion of the penetration hole A;
    a penetration hole B that passes through the hole filling resin and another portion of the first portion of the signal line of the coaxial wire; and
    a plated layer arranged on an inner wall of the penetration hole B, wherein the metal film circuit and the outer peripheral conductor and the signal line of the coaxial wire are connected.

7. The multilayer wiring plate according to claim 6, wherein the metal film circuit is a ground, and the outer peripheral conductor of the coaxial wire is connected to the ground through a surface layer circuit.

8. The multilayer wiring plate according to claim 7, wherein the surface layer circuit and the ground are connected through a non-penetration through-hole.

9. The multilayer wiring plate according to claim 7, wherein the surface layer circuit and the ground are connected through a penetration through-hole.

10. A method for fabricating the multilayer wiring plate according to claim 6, the method comprising:
    forming a non-penetration hole of a depth such that the non-penetration hole does not reach the outer peripheral conductor of the coaxial wire from each of front and back surfaces of the multilayer wiring plate;
    laser-processing a bottom part of the non-penetration hole, removing the outer peripheral conductor of the coaxial wire, leaving the first portion of the signal line, and forming the penetration hole A;
    the hole filling resin inside the penetration hole A;
    forming the penetration hole B of a diameter smaller than a diameter of the penetration hole A in the hole filling resin filled inside the penetration hole A, and exposing a cross section of the signal line of the coaxial wire to an inner wall of the penetration hole B; and
    forming the plated layer inside the penetration hole B and in contact with the cross section of the signal line of the coaxial wire exposed to the inner wall of the penetration hole B.

11. The method for fabricating the multilayer wiring plate according to claim 8, the method comprising:
    forming a non-penetration hole of a depth such that the non-penetration hole does not reach the outer peripheral conductor of the coaxial wire from each of front and back surfaces of the multilayer wiring plate;
    laser-processing a bottom part of the non-penetration hole, removing the outer peripheral conductor of the coaxial wire, leaving the first portion of the signal line, and forming the penetration hole A;
    filling the hole filling resin inside the penetration hole A;
    forming the penetration hole B of a diameter smaller than a diameter of the penetration hole A in the hole filling resin filled inside the penetration hole A, and exposing a cross section of the signal line of the coaxial wire to an inner wall of the penetration hole B;
    forming the plated layer inside the penetration hole B and in contact with the cross section of the signal line of the coaxial wire exposed to the inner wall of the penetration hole B;
    forming a non-penetration hole reaching the outer peripheral conductor of the coaxial wire from the surface layer circuit, and exposing the outer peripheral conductor of the coaxial wire to a bottom part of the non-penetration hole; and
    forming the plated layer inside the non-penetration hole and in contact with the cross section of the signal line of the coaxial wire exposed to the inner wall of the penetration hole B.

12. A method for fabricating a multilayer wiring plate, comprising:
    providing a multilayer wiring plate comprising a coaxial wire including a signal line, an insulation coating around the signal line, and an outer peripheral conductor arranged on the insulation coating; a metal film circuit; and an insulating layer provided between the coaxial wire and the metal film circuit;
    forming non-penetration holes from each of front and back surfaces of the multilayer wiring plate to depths such that each of the non-penetration holes does not reach the outer peripheral conductor of the coaxial wire;
    laser-processing a bottom part of each of the non-penetration holes to remove the outer peripheral conductor of the coaxial wire, leaving a first portion of the signal line, and forming a penetration hole A;
    filling a hole filling resin inside the penetration hole A;
    forming a penetration hole B of a diameter smaller than a diameter of the penetration hole A in the hole filling resin filled inside the penetration hole A, and exposing a cross section of the signal line of the coaxial wire to an inner wall of the penetration hole B; and
    forming a plated layer inside the penetration hole B and in contact with the cross section of the signal line of the coaxial wire exposed to the inner wall of the penetration hole B.

* * * * *